United States Patent [19]

Kornrumpf

[11] Patent Number: 4,868,448

[45] Date of Patent: Sep. 19, 1989

[54] PIEZOELECTRIC RELAY SWITCHING MATRIX

[75] Inventor: William P. Kornrumpf, Albany, N.Y.

[73] Assignee: General Electric Company, Schenectady, N.Y.

[21] Appl. No.: 244,647

[22] Filed: Sep. 13, 1988

Related U.S. Application Data

[63] Continuation of Ser. No. 130,753, Dec. 9, 1987, abandoned, which is a continuation-in-part of Ser. No. 911,171, Sep. 24, 1986, abandoned.

[51] Int. Cl.[4] .............................................. H01L 41/08

[52] U.S. Cl. .................................... 310/331; 200/181; 310/367; 310/332

[58] Field of Search ................................ 310/328-332, 310/357-359, 367, 368, 370, 800; 200/181

[56] References Cited

U.S. PATENT DOCUMENTS 4,595,855 6/1986 Farrall ................................ 310/332

4,654,555 3/1987 Ohba et al. .......................... 310/332

4,670,682 6/1987 Harnden, Jr. et al. ............. 310/332

4,697,118 9/1987 Harnden, Jr. et al. ............. 310/331

4,714,847 12/1987 Harnden, Jr. et al. ......... 310/330 X 4,742,263 5/1988 Harnden, Jr. et al. ......... 310/367 X

FOREIGN PATENT DOCUMENTS 273157 7/1964 Australia ............................ 310/331

52-60005 5/1975 Japan .................................. 310/332

*Primary Examiner*—Mark O. Budd

*Attorney, Agent, or Firm*—Robert Ochis; James C. Davis, Jr.; Marvin Snyder

[57] ABSTRACT

A switching matrix includes at least one array of piezoelectric relays whose cantilevered drive elements are in the form of a unitary, comb-shaped structure of the piezoceramic mateial. Each drive element carries adjacent its free end at least one movable contact for engagement with one or more fixed contacts in either single or double throw fashion. The movable contacts may be mounted on housing walls enclosing the relay array or on a separate substrate also mounting the drive element unitary structure. Row and column conductors or conductor pairs are connected into the relay contacts by non-intersecting conductor runs printed on the surfaces of the housing walls or on the substrate.

94 Claims, 5 Drawing Sheets

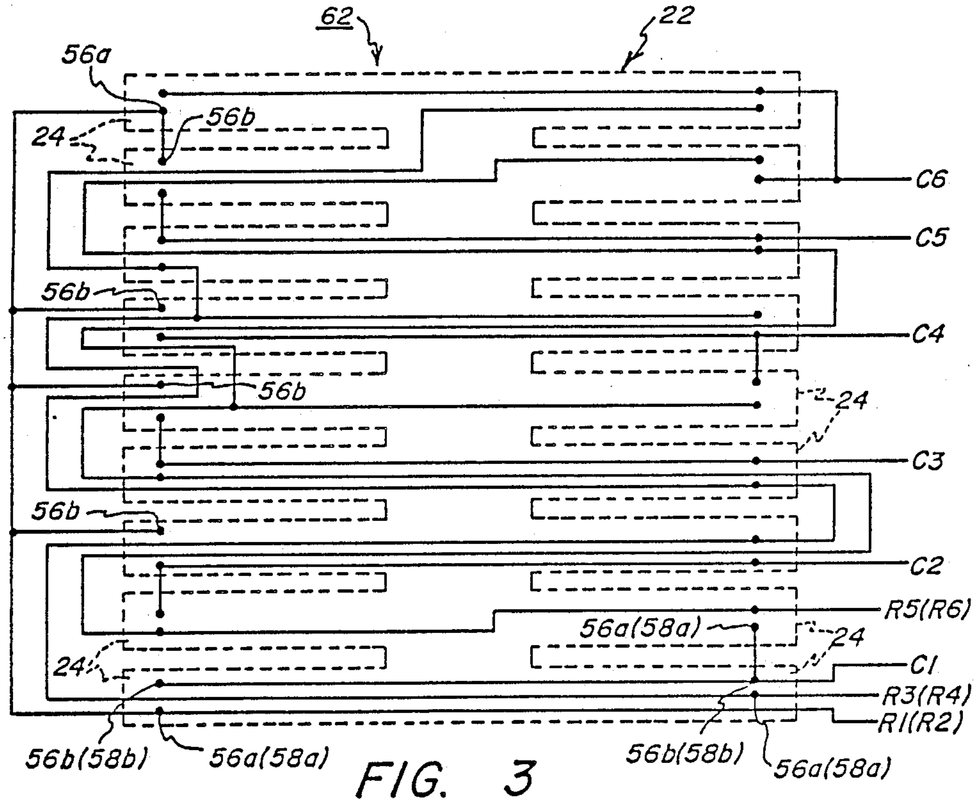
FIG. 3
FIG. 4
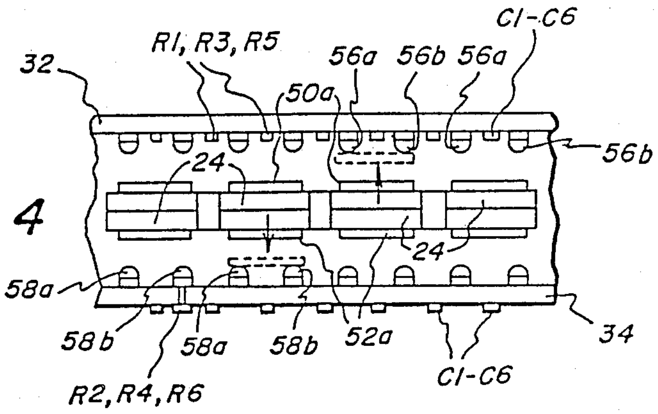

PIEZOELECTRIC RELAY SWITCHING MATRIX

This application is a continuation of application Ser. No. 130,753, filed Dec. 9, 1987 which is a continuation-in-part of application Ser. No. 911,171 filed Sept. 24, 1986, now abandoned.

BACKGROUND OF THE INVENTION

The present invention relates to piezoelectric relays and more particularly to piezoelectric relays arranged as a matrix switch.

Heretofore, matrix switches, particularly those adapted for telecommunication applications, have typically been implemented using electromagnetic relays. Over the years, improvements in electromagnetic relay designs have resulted in increased efficiency and reduced physical size. Nevertheless, such relays have their drawbacks. They are relatively complex and expensive to manufacture. Their operating coils require a multitude of turns of very fine wire The coil resistance, though low, nevertheless consumes significant power with the accompanying generation of heat. When a plurality of electromagnetic relays are incorporated in a matrix switch configuration, power consumption and heat generation becomes substantial. This is particularly so if the relay actuated state is held by sustained coil energization. An alternative is to provide elaborate mechanisms for releasably holding the relays in their actuated states. Moreover, in large switching matrices the number of wiring interconnections between relays becomes very large, rendering manufacture involved and expensive.

Recent improvements in piezoceramic materials have made piezoelectric relays an attractive alternative to their electromagnetic counterparts. Piezoelectric relay drive elements may be batch fabricated from a number of different polycrystalline ceramic materials such as barium titanate, lead zirconate titanate, lead metaniobate and the like, which are precast and fired into a variety of desired shapes, such as rectangular-shaped, thin plates. Piezoelectric relays require very low actuating power, dissipate minimal power to hold an actuated state without outside assistance, and draw no current while in their quiescent state. Consequently, piezoelectric relays generate miniscule heat. They can be implemented in smaller physical sizes than comparably rated electromagnetic relays and require fewer, far simpler component parts. The electrical characteristics of piezoelectric drive elements are basically capacitive in nature and thus, unlike electromagnetic relays, are immune to stray magnetic fields.

A principal object of the present invention is to provide an improved matrix switch.

An additional object is to provide an improved matrix switch having particular, but limited application to the telecommunications field.

A further object is to provide a matrix switch of the above character utilizing piezoelectric switch actuating elements.

Another object is to provide a piezoelectric relay switching matrix utilizing an array of piezoelectric relays efficiently arranged in a compact matrix assembly.

Yet another object is to provide a piezoelectric relay switching matrix of the above-character which is amenable to batch fabrication utilizing printed circuit wiring techniques.

An additional object is to provide a piezoelectric relay switching matrix of the above-character, wherein printed circuit wiring of the matrix switch points is achieved without wiring cross-overs.

A further object is to provide a piezoelectric relay switching matrix of the above-character, wherein a minimum number of switch terminals is required.

Another object is to provide a piezoelectric relay switching matrix of the above-character which is efficient in design, convenient to manufacture, compact in size and reliable in operation over a long lifetime.

Other objects of the invention will in part be obvious and in part appear hereinafter.

SUMMARY OF THE INVENTION

In accordance with the present invention, there is provided a piezoelectric relay switching matrix including a planar array of individually operable bimorph drive elements commonly, cantilever mounted within a housing. Mounted adjacent the free end of each drive element is at least one movable contact poised in gapped relation with at least one associated fixed contact mounted on a wall of the housing or a support member commonly mounting the drive elements. Electrical activation of selected drive elements produces deflections thereof effective in bring their movable contacts into electrical contacting engagement with the associated fixed contacts. Switching motion may be single throw or double throw. In the latter case, each drive element is adapted to selectively deflect in opposite directions to engage either one of a pair of associated fixed contacts. Each movable contact may be in the form of a shorting bar engageable with a pair of closely spaced fixed contacts. To wire the switching matrix, the row and column conductors thereof are applied to opposed surfaces of the fixed contact mounting members in printed circuit fashion with appropriate electrical connections made to the various relay contacts. The multilevel, planar layout of these conductor runs is such as to eliminate wiring cross-overs, and thus resort to multilayer printing techniques is avoided.

The invention accordingly comprises the features of construction, arrangements of parts and combinations of elements which will be exemplified in the constructions hereinafter set forth, and the scope of the invention will be indicated in the claims.

For a better understanding of the nature and objects of the present invention, reference may be had to the following detailed description taken in conjunction with the accompanying drawings, in which:

FIG. 3 is a plan view, partially in schematic form, of a piezoelectric relay switching matrix constructed in accordance with an alternative embodiment of the invention;

FIG. 4 is a fragmentary side elevational view of the switching matrix of FIG. 3;

Like reference numerals refer to corresponding parts throughout the several views of the drawings.

DETAILED DESCRIPTION OF THE INVENTION

Figure 1:
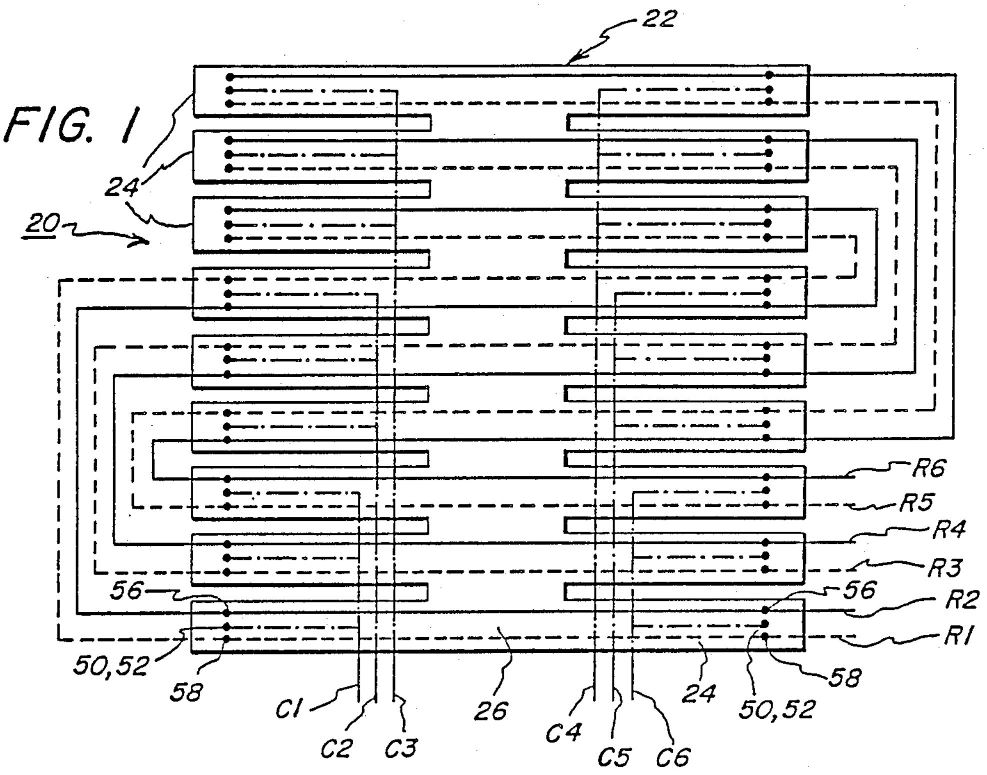
FIG. 1 is a plan view, partially in schematic form, of a piezoelectric relay switching matrix constructed in accordance with one embodiment of the present invention.
Figure 2:
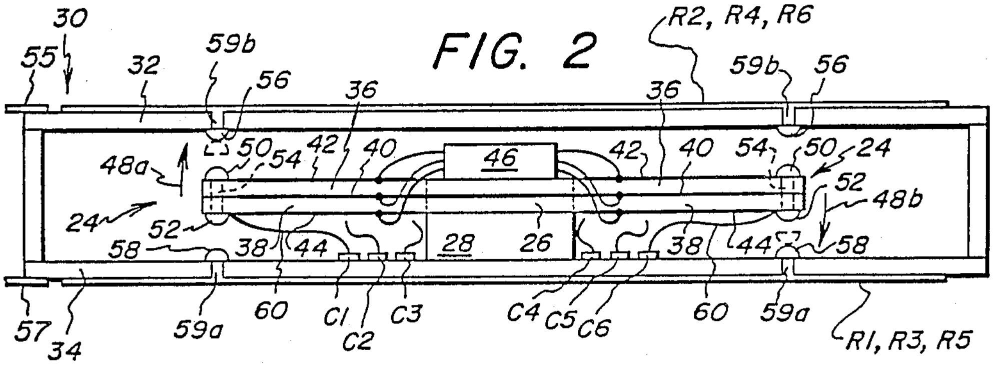
FIG. 2 is a side elevational view of the switching matrix of FIG. 1.

In the embodiment of the invention seen in FIGS. 1 and 2, a piezoelectric relay switching matrix, generally indicated at 20, includes a planar, unitary array 22 of individual bimorph drive elements 24. The drive element array is preferably of a configuration resembling a comb having a centrally located back or spine 26 with the individual drive elements extending in distributed, parallel relation, from both sides of the spine, in the tooth-like fashion. As seen in FIG. 2, drive element array 22 is fixedly mounted along its spine 26 atop a pedestal 28 supported within a housing 30. The individual bimorph drive elements 24 are thus seen to be cantilever mounted with their free ends uniformly spaced between an upper housing wall 32 and a lower housing wall 34. Each drive element is comprised of a pair of piezoceramic plates 36 and 38 bonded together in sandwich fashion with a common, intervening surface electrode 40. This intervening electrode may be common to all of the drive elements 24. The exposed upper surface of plate 36 is coated with a conductive metal to provide an electrode 42, while the exposed lower surface of plate 38 is similarly electroded, as indicated at 44. The plates are formed of a known piezoceramic material, such as lead zirconate titanate (PZT), while the surfaces electrodes are provided by deposited coatings of a suitable metal, such a nickel, silver and the like.

As illustrated diagrammatically in FIG. 2, an integrated circuit package 46 may be mounted atop spine 24 with separate output leads connected with the various electrodes 40, 42, and 44 of each of the drive elements 24. In response to selection signals, this integrated circuitry applies an activating voltage across one or the other of the piezoceramic plates 36, 38 of a selected one or selected plural drive elements to produce deflections thereof either upwardly, as indicated by arrow 48*a*, or downwardly, as indicated by arrow 48*b*. The mechanisms operative in producing deflections of a cantilever mounted piezoceramic bimorph bender element, such as drive elements 24, are well understood in the art.

Still referring to FIG. 2, mounted adjacent the free end of each drive element is an opposed pair of movable contacts 50 and 52 electrically connected in common by an interconnecting stud 54. Mounted to the underside of housing top wall 32 in opposed, gapped relation to each upper movable contact 50 is a separate fixed contact 56, while a separate fixed contact 58 is mounted to the upper side of housing bottom wall 34 in opposed, gapped relation to each movable contact 52. Thus, upon upward deflection of a selected drive element 24, its movable contact 50 is engaged with the opposed one of the fixed contacts 56, and, upon downward deflection of a selected drive element, its movable contact 52 engages the opposed one of the fixed contacts 5B. Contact engagement is sustained as long as the charged state of one of the piezoceramic plates 36, 38 is held. In their unactivated, quiescent state, the drive elements are situated as seen in FIG. 2 with movable contacts 50 and 52 in essentially uniformly gapped relation with fixed contacts 56 and 58, respectively. It is thus seen that each drive element 24, together with its associated movable contacts 50, 52 and fixed contacts 56, 58, constitute a single pole, double throw piezoelectric relay.

Wiring the fixed and movable contacts of switching matrix 20 to create a 6×6 matrix utilizing eighteen double throw (upward and downward deflecting) drive elements 24 is illustrated in FIG. 1. Reference numerals R1 through R6 indicate what may be considered as six row conductors, and reference numerals C1 through C6 indicate six column conductors. As seen in FIG. 2, column conductors C1, C2 and C3 are printed circuit conductor runs applied to the upper surface of the housing bottom wall 34 to the left of pedestal 26, while column conductors C4, C5 and C6 are printed circuit conductor runs applied to the upper surface of wall 34 to the right of the pedestal. These column conductors are represented by dash-dot lines in FIG. 1. Thus it is seen that column conductor C1 is connected, via flying leads 60 to the movable contacts 50 and 52 of the lower left three drive elements 24. Column conductor C2 is then connected via flying leads to the movable contacts of the intermediate three drive elements extending leftwardly from spine 26, and column conductor C3 is connected to the movable contacts of the upper left three drive elements. Column conductors C4, C5, and C6 are respectively connected to the movable contacts of the three upper right, the three middle right, and the three lower right drive elements 24, all as seen in FIG. 1

Row conductors R2, R4 and R6, shown in solid line, are provided as printed circuit conductor runs laid out in serpentine fashion on the upper or outer surface of housing upper wall 32. It will be appreciated that these row conductors could be printed on the inner surface of housing wall 32. Row conductors R1, R3 and R5, shown in dash line, are printed on the lower or outer surface of housing wall 34 in serpentine fashion. As illustrated, row conductor R1 is connected, via studs 59*a* extending through holes in housing wall 34, to the fixed contacts 58 associated with the first, sixth and seventh left and right drive elements 24, counting up from the bottom of FIG. 1. Row conductor R2 is connected via studs 59*b* penetrating housing wall 32 to the fixed contacts 56 also associated with the first, sixth and seventh opposed pairs of oppositely extending drive elements. Similarly, row conductors R3 and R4 are respectively connected to the fixed contacts 58 and 56 associated with the second, fifth and eighth opposed pairs of drive elements 24, while row conductors R5 and R6 are respectively connected to the fixed contacts 58 and 56 associated with the third, fourth and ninth opposed pairs of drive elements. Housing wall 32 supports a first plurality of terminals 55 for making electrical contact with fixed contacts 56, while housing wall 34 supports a second plurality of terminals 57 for making electrical contact with fixed contacts 58. It will be appreciated that only one terminal 55 and one terminal 57 are visible in FIG. 2.

From the foregoing description, it is seen that any column conductor can be connected to any row conductor by appropriate activation of a selected one of the drive elements. Thus, for example, if the lower right drive element 24 is activated to deflect downwardly, its relay contacts 52, 58 are engaged to connect column conductor C6 to row conductor R1. An input signal applied to column conductor C6 is thus outputted on row conductor R1, or vice versa. It will be appreciated that multiple drive elements may be activated to route an input signal applied to one row or column conductor out onto a selected plurality of column or row conductors. By virtue of the serpentine layout of the row conductors, no cross-overs exist, and thus resort to dual layer conductor run printing is advantageously avoided.

Figure 8:
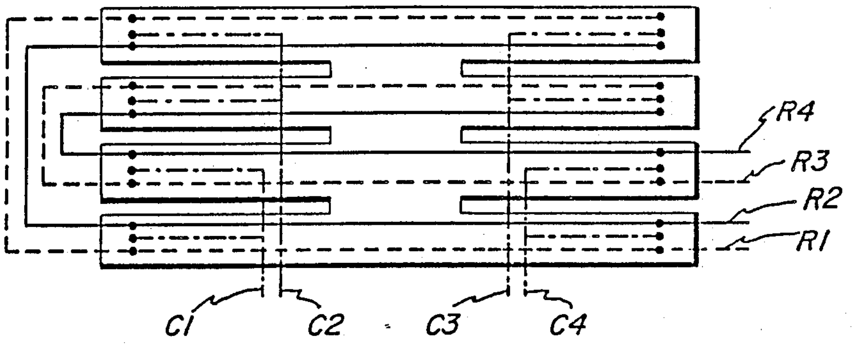
FIG. 8 is a plan view, partially in schematic form, of a piezoelectric relay switching matrix constructed in accordance with the FIG. 1 embodiment, but with fewer connection points.

The 6×6 matrix 20 of FIG. 1 can be connected as a 4×4 matrix by leaving the terminals for columns C3 and C4 and rows R5 and R6 unconnected and can be made into a 4×4 matrix by deleting the column conductors C3 and C4 and the row conductors R5 and R6. That would leave the third, fourth, seventh, eighth and ninth piezoelectric fingers from the bottom on each side in FIG. 1 unused. The first, second, fifth and sixth fingers from the bottom of each side would be used. By moving the conductors on the fifth and sixth fingers to the unused third and fourth fingers, a 4×4 matrix is provided which uses the lower four fingers on each side. Since the upper five fingers on each side are unused, they may then be deleted without adverse effect on the matrix switch. The resulting structure is shown in FIG. 8 as a 4×4 switching matrix 20'.

The piezoelectric relay switching matrix embodiment in FIGS. 3 and 4, generally indicated at 62, differs from the embodiment 20 of FIGS. 1 and 2 basically from the standpoint that the movable contacts carried by the drive elements 24 are not wired to the column conductors by flying leads 60 as described above. Instead, each drive element, as best seen in FIG. 4 carries separate, upper and lower movable contacts in the form of shorting bars **50*a* and 52*a*, respectively, which are not electrically interconnected. Each upper shorting bar 50*a* is engageable with an associated pair of closely spaced fixed contacts 56*a* and 56*b* to complete a circuit therebetween. Similarly, each lower shorting bar 52*a* is engageable with an associated pair of fixed contacts 58*a* and 58*b*, completing a circuit therebetween. The pairs of fixed contacts 56*a*, 56*b* are mounted to the undersurface of housing top wall 32, while the pairs of fixed contacts 58*a*, 58*b* are mounted to the upper surface of housing bottom wall 34. It then remains to wire the column conductors into one fixed contact of selected pairs and the row conductors into the other fixed contact of selected pairs to create a relay switching matrix. It will be appreciated that housing walls 32 and 34 support terminals (not shown) similar to terminals 55, 57 (FIG. 2**) for making electrical connection to the various fixed contacts.

FIG. 3 depicts in dashed outline the combshaped, planar, one-piece array 22 of eighteen drive elements 24 appropriate for a 6×6 switching matrix. The row and column conductor layout seen in FIG. 3, which may be printed on the undersurface of upper housing wall 32, includes the six column conductors C1 through C6, but only three row conductors, for example, R1, R3 and R5. The same conductor layout is duplicated on the outer or lower surface of housing wall 34, except that the designated row conductors R2, R4 and R6 are involved instead of row conductors R1, R3 and R5. This is indicated in FIG. 3 by the parentheses around each of the row numbers R2, R4 and R6 and the contact reference numerals **58*a* and 58*b*. Thus, for example, row conductor R1, printed on housing wall 32, is routed about for convenient electrical connection with fixed contact 56*a* associated with (again counting from the bottom) the first left drive element 24, fixed contacts 56*b* of the third, fifth, sixth and eighth left drive elements, and fixed contact 56*a* of the ninth left drive element. Then, row conductor R2, printed on the lower side of housing wall 32 is connected to fixed contact 58*a* associated with the first left drive element, fixed contacts 58*b* of the third, fifth, sixth, and eighth left drive elements, and fixed contact 58*a* of the ninth left drive element. Row conductors R3 and R5 in the one layout, and row conductors R4 and R6 in the other layout are routed about in serpentine fashion for connection to the various fixed contacts illustrated in FIG. 3** without cross-overs.

As indicted above, the routing of column conductors C1–C6 is the same for the layouts printed on the two walls, except that for the one on wall 32 the column conductors C1–C6 are connected to selected ones of the fixed contact pairs **56*a*, 56*b*, while the column conductors C1–C6 of the layout on wall 34 are connected to selected ones of the fixed contact pairs 58*a* , 58*b*. While not shown, it will be understood the corresponding column conductors of the two layouts are connected in common externally of the switching matrix 62** to provide a full 6×6 matrix. If they are not externally connected, then a dual 3×6 matrix results.

As seen in FIG. 3, column conductor C1 of the layout printed on wall 32 is connected to fixed contacts **56*b* associated with the first left and first right drive elements 24, and to fixed contact 56*a* of the second right drive element. In addition, column conductor C1 of the layout on wall 34 is connected to fixed contacts 58*b* of the first left and first right drive elements, and to fixed contact 58*a* of the second right drive element. Thus, for example, if the first right drive element is activated to deflect upwardly, as seen in FIG. 4, its shorting bar 50*a* bridges associated fixed contacts 56*a* , 56*b* to connect column conductor C1 to row conductor R3. On the other hand, if the first right drive element deflects downwardly to bridge associated contacts 58*a*, 58*b* via its shorting bar 52*a*, column conductor C1 is connected to row conductor R4. Similarly, it is seen that the first left drive element can deflect upwardly to connect column conductor C1 to row R1 or downwardly to connect column conductor C1 to row conductor R2. All of the other matrix switch points for connecting any column conductor to any selected row conductor or conductors can be readily traced through in the illustration of FIG. 3**.

Figure 9:
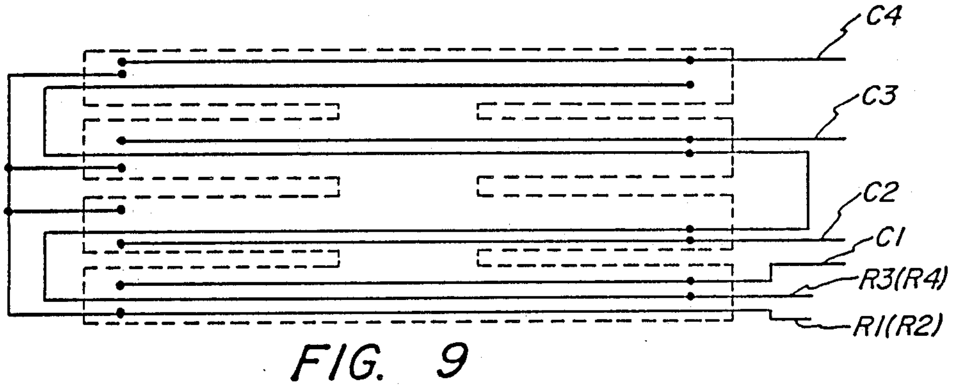
FIG. 9 is a plan view, partially in schematic form, of a piezoelectric relay switching matrix constructed in accordance with the FIG. 3 embodiment, but with fewer connection points.

The 6×6 switching matrix 62 of FIG. 3 may be connected as a 4×4 matrix by leaving the terminals for columns C5 and C6 and rows R5 and R6 unconnected and may be made into a 4×4 matrix by deleting the column conductors C5 and C6 and the row conductors R5 and R6. That would leave the second, fifth, seventh, eighth and ninth piezoelectric fingers on the right and the second, fourth, seventh, eighth and ninth fingers on the left unused in FIG. 3. The remaining conductors on the third finger on each side would then be moved to the second fingers, the remaining conductors on the fourth finger on the right and the fifth finger on the left could then be moved to the third fingers and the remaining conductors on the sixth fingers could be moved to the fourth fingers. The fifth through ninth fingers on both sides would then be unused and could be deleted. The resulting structure would be the 4×4 matrix 62' shown in FIG. 9.

Figure 5:
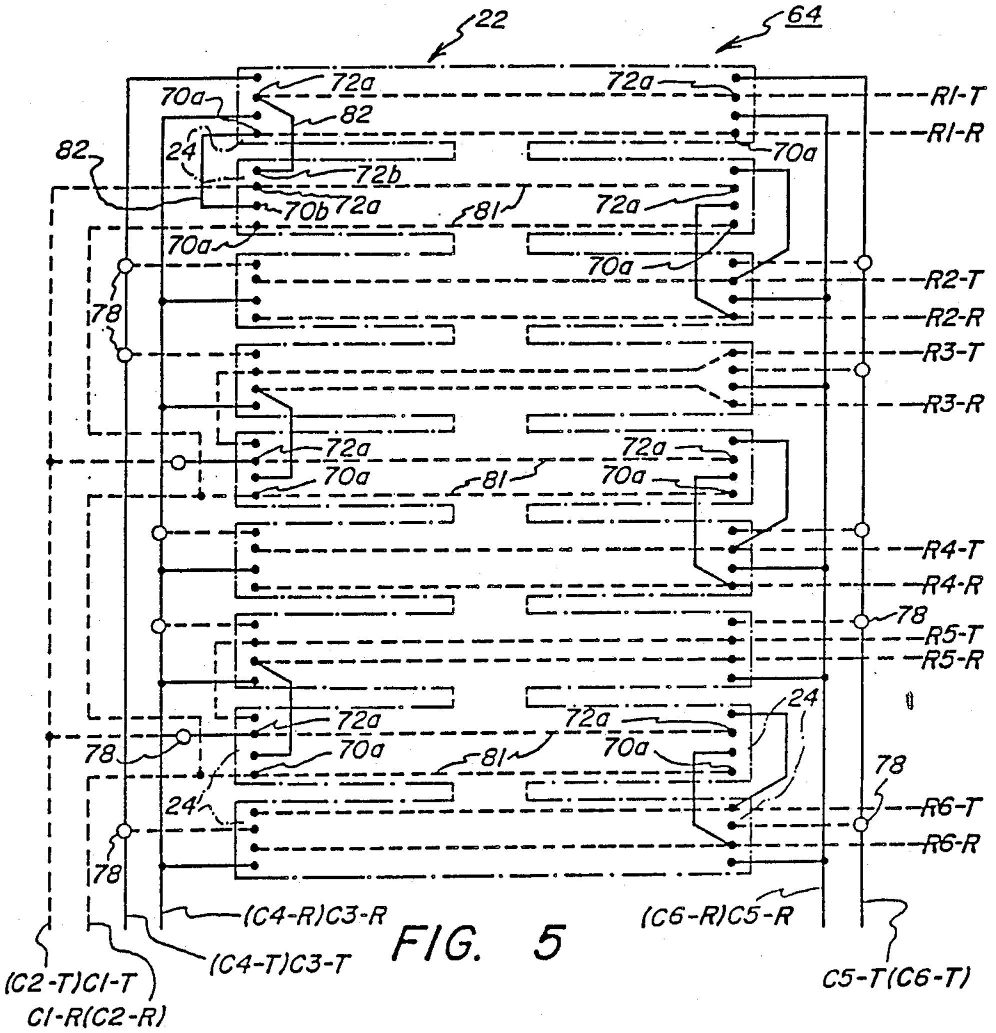
FIG. 5 is a plan view, partially in schematic form, of a piezoelectric relay switching matrix constructed in accordance with another embodiment of the present invention.
Figure 6:
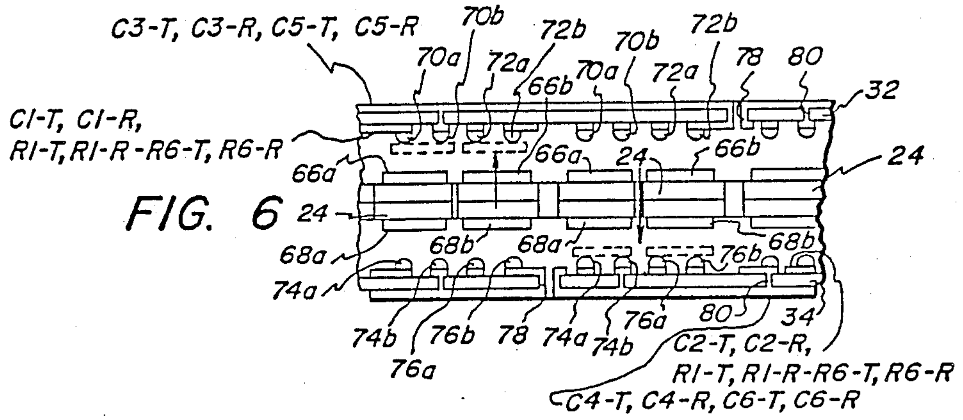
FIG. 6 is a fragmentary side elevational view of the switching matrix of FIG. 5.

In the embodiments thus far described, each piezoelectric relay operates to connect a single column conductor to a single row conductor. In most telecommunication applications, such as telephony, both sides of a circuit must be switched concurrently. To this end, the switching matrix embodiment of FIG. 5 and 6, generally indicated at 64, is a variant of the embodiment of FIGS. 3 and 4 structured to connect any one column conductor pair of tip and ring conductors to any selected one row conductor pair of tip and ring conductors. Thus, switching matrix 64, as seen in FIG. 5, includes a comb-shaped, planar array 22 of piezoelectric drive elements 24, shown in dash-dot outline and mounted in the manner shown in FIG. 2. As seen in FIG. 6, mounted at the free end of each drive element are a pair of upper, electrically isolated shorting bars 66*a* and 66*b*, and a pair of lower, electrical isolated shorting bars 68*a* and 68*b*. Mounted to the inner surface of housing wall 32 in opposed, gapped relation to each upper shorting bar 66*a* are a pair of closely spaced fixed contacts 70*a* and 70*b*, while a closely spaced pair of fixed contacts 72*a* and 72*b* are similarly mounted in opposed, gapped relation to each shorting bar 66*b*. Fixed contact pairs 74*a*, 74*b* and 76*a*, 76*b* are mounted on the inner surface of housing wall 34 in opposed, gapped relation to shorting bars 68*a* and 68*b*, respectively, of each drive element 24. By virtue of this construction, when a drive element deflects upwardly, its shorting bar 66*a* bridges fixed contact pair 70*a*, 7O*b* , and its shorting bar 66*b* bridges fixed contact pair 72*a*, 72*b*. Similarly, when a drive element deflects downwardly, its shorting bars 68*a* and 68*b* respectively bridge fixed contact pairs 74*a*, 74*b* and 76*a*, 76*b*. As will be seen in FIG. 5, the column conductor pairs are wired into one fixed contact of each of the pairs associated with selected drive elements, for example fixed contacts 70*a* and 72*a*, while the row conductor pairs are wired into the other fixed contacts 70b and 72*b* of the two fixed contact pairs associated with selected drive elements.

Referring to FIG. 5, the row and column conductor pair layout seen therein is printed on the opposed surfaces of housing wall 32 and includes the six row conductor pairs R1-T, R1-R through R6-T, R6-R of a 6×6 switching matrix, but only three column conductor pairs, for example, C1-T, C1-R, C3-T, C3-R, and C5-T, C5-R. The identical conductor layout is duplicated on the opposed surfaces of the housing wall 34 to handle the other three column conductor pairs, C2-T, C2-R, C4-T, C4-R, and C6-T, C6-R. Thus, the overall structure is a dual 3 x 6 switching matrix which is easily wired to provide a 6×6 switching function in the manner discussed above in connection with FIG. 1. However, if a dual 3×6 matrix is desired, that additional wiring is omitted. It will be assumed, for purposes of description, that the conductor runs shown in solid line in FIG. 5 are printed on the outer surface of housing wall 32 (FIG. 6), while the conductor runs shown in phantom or dash line are printed on the inner surface of this wall. This same convention may apply for the conductor layout printed on the opposed surfaces of housing wall 34. Again the conductor layout on each surface is executed in a manner as to avoid cross-overs. To this end, numerous situations call for conductive transitions from one wall surface to the opposite surface, which are effected by way of plated holes or vias 78. In some cases, these vias are executed at the sites of fixed contacts through the utilization of conductive studs 80, as seen in FIG. 6. The upper wall 32 is a printed circuit substrate which supports the associated printed circuit conductors, any vias 78, studs 80 and the fixed contacts 70*a*, 70*b*, 72*a* and 72*b*. The lower wall 34 is a printed circuit substrate which supports the associated printed circuit conductors, any vias 78, studs BO, the fixed contacts 74*a*, 74*b*, 76*a* and 76*b*, and in accordance with FIG. 2, a pedestal on which the drive element array is secured with each movable contact thereof in alignment with the fixed contacts which it bridges upon appropriate activation of its drive element.

Considering FIG. 5, the column one tip conductor C1-T runs on the inner surface of wall 32 to the fixed contact 72*a* associated with the eighth left drive element 24 and to fixed contact 72*a* of the eighth right drive element by way of conductor run 81 printed on the inner surface of wall 32, with transitions to the upper surface of wall 32 by way of vias 78 to connect into fixed contacts 72*a* of the second left and fifth left drive elements. These fixed contacts are connected in common with corresponding fixed contacts 72*a* of the second and fifth right drive elements via studs SO and conductor runs B1. The column one ring conductor C1-R runs over the inner surface of wall 32 to fixed contacts 70*a* of the second, fifth and eighth left drive elements and via conductor runs 81 to fixed contacts 70*a* of the second, fifth and eighth right drive elements. It will be understood that the column twotip and ring conductors C2-T, C2-R are laid out on the opposed surfaces of housing wall 34 in identical fashion to feed fixed contacts 74*a*, and 76*a* of the same drive elements.

Still referring to FIG. 5, the row one tip conductor R1-T runs on the inner surface of wall 32 to fixed contacts 72*a* of the ninth left and right drive elements 24, and via a stud 80 and jumper 52*a* printed on the upper surface of wall 32 to fixed contact 72*b* of the eighth left drive element. The column one ring conductor R1-R similarly runs on the inner surface of wall 32 to fixed contacts 70*a* and the ninth left and right drive elements and via a stud 80 and jumper 82*b* printed on the upper surface of wall 32 to fixed contact 70*b* of the eighth left drive element. Again it will be understood that the row one tip and ring conductors R1-T and R1-R are laid out on the surfaces of wall 34 to feed the corresponding fixed contacts 76*a* and 76*b* of the ninth left and right and eight left drive elements.

From the foregoing, it is seen that, for example, upward deflection of the eighth left drive element causes its shorting bar 66*a* to bridge associated fixed contacts 70*a*, 70*b* and its shorting bar 66*b* to bridge associated fixed contacts 72*a*, 72*b*. As a result, the column one tip and ring conductors C1-T and C1-R are respectively connected to the row one tip and ring conductors R1-T and R1-R. On the other hand, downward deflection of the eighth left drive element connects the column two tip and ring conductors C2-T, C2-R to the row one tip and ring conductors R1-T, R1-R. All of the other matrix switch points for connecting any column tip and ring conductor pair to any selected row tip and ring conductor pair can be readily traced through in the FIG. 5 schematic. It is seen that in each case, a single drive element acts to connect a single column conductor pair to a single row conductor pair in concert. The row and column conductor printed circuit layouts are accomplished on four readily available housing wall surfaces without resort to cross-overs on any one wall surface.

Figure 7:
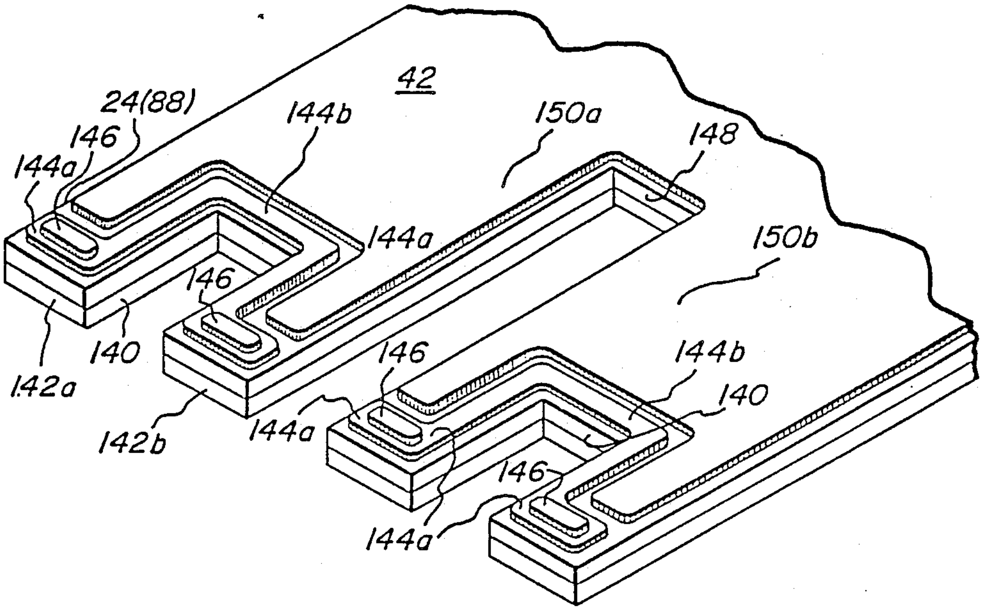
FIG. 7 is a fragmentary perspective view of the movable contact end of a bimorph drive element applicable to the switching matrix embodiments of FIGS. 3 and 5.
Figure 10:
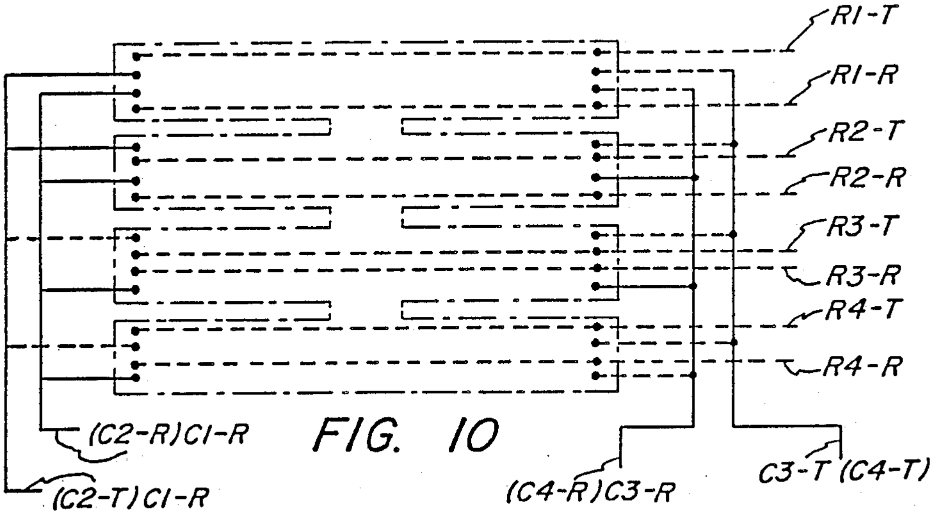
FIG. 10 is a plan view, partially in schematic form, of a piezoelectric relay switching matrix constructed in accordance with the FIG. 5 embodiment, but with fewer connection points.

The 6×6 pair switching matrix 64 of FIG. 5 may be connected as a 4×4 pair switching matrix by leaving the terminals for the column conductor pairs for columns C1 and C2 and the row conductor pairs for rows R1 and R2 unconnected and may be made into a 4×4 pair switching matrix by deleting the column conductor pairs for columns C1 and C2 and the row conductor pairs for rows R1 and R2. That would leave the second, fifth, seventh, eighth and ninth piezoelectric fingers on each side unused. The conductors on the third fingers would then be moved to the second fingers, the conductors on the fourth fingers would be moved to the third fingers and the conductors on the sixth fingers would be moved to the fourth fingers. The fifth through ninth fingers on each side would then be unused and could be deleted. The resulting structure is shown in FIG. 10 as a 4×4 pair switching matrix 64' in which each row and column number from FIG. 5 has been decreased by 2 to yield row and column numbers ranging from 1 to 4 rather than from 3 to FIG. 7 illustrates a preferred free end configuration for the drive element 24 when the movable contacts are in the form of shorting bars. In the case of the single pole piezoceramic relay configuration of switching matrix 62 in FIGS. 3 and 4, the free end of each drive element 24 is bifurcated by virtue of a shallow slot 140 to provide a pair of relatively independently flexible fingers **142*a* and 142*b*. Conductive pads 144*a* are deposited on the surfaces of these fingers adjacent their free ends and are integrally connected in common by a conductor run 144*b* routed around the closed end of slot 140. Contact buttons 146 are affixed to or plated on pads 144*a* so as to make electrical contact therewith. It is seen that surface electrode 42 terminates short of pads 144*a* and interconnecting run 144*b*. It will be appreciated that this shorting bar configuration is duplicated on the undersurface of drive element 24** in opposed registry.

By virtue of this construction, fingers **142*a* and 142*b* are capable of flexing independently of each other to ensure good electrical contacting engagement with the opposed pair of fixed contacts, e.g. 56*a* and 56*b* in FIG. 4**, despite minor variations in the relative heights thereof and/or despite possibly slight twisting of the drive element incident with its deflection.

For the double pole piezoelectric relay configurations of switching matrix 64 in FIGS. 5 and 6, the free end of each drive element is provided with a centrally located deep slot 148 to create a pair of relatively independently flexible switching poles **150*a* and 150*b*. Each pole is bifurcated via slots 140 in the manner shown in FIG. 7, and described above. The formation of the pads 144*a*, interconnecting run 144*b*, and contact buttons 146** is duplicated for each pole, as shown. The advantages gained from this construction have been alluded to above.

While double throw versions of these relays have been shown and described, it will be understood that single throw versions may also be made. Single throw versions may be normally open, normally closed or may have some contacts which are normally open and others which are normally closed, all in accordance with the height of each fixed contact relative to the unactivated position of its associated movable contact.

It will thus be seen that the objects set forth above, including those made apparent from the preceding description, are efficiently attained and, since certain changes may be made in the above constructions without departing from the scope of the invention, it is intended that all matter contained in the above description or shown in the accompanying drawing shall be interpreted as illustrative and not in the limiting sense.

Having described the invention, what is claimed as new and desired to secure by Letter Patent is:

1. A piezoelectric switching matrix comprising, in combination:

a. a planar array of piezoelectric relays, each of said relays including (1) an elongated drive element having opposed fixed and free ends, (2) a movable contact mounted on said drive element adjacent said free end thereof, and (3) a fixed contact, b. a support member;

c. first means securing said fixed ends of said elements in fixed relation to said support member with said drive elements of all of said relays disposed in a common d. each of said relays having said fixed contact thereof disposed on said support member in aligned relation to said movable contact thereof;

e. four first conductors disposed on said support member as printed circuit conductors; and f. four second conductors;

each of said first and second conductors being permanently connected to at least one of said contacts of at least two different ones of said relays and the number of said first conductors, the number of said second conductors, the distribution of their connections to said relay contacts and the number of relays being related in a manner which enables any one of said first conductors to be connected to any one of said second conductors by activation of said drive element of a corresponding one of said relays to engage said fixed and movable contacts thereof wherein said corresponding one of said relays is the one of said relays whose closure connects said one of said first conductors to said one of said second conductors.

2. The switching matrix defined in claim 1, wherein said drive elements of said planar array of relays are formed as a unitary structure of piezoceramic material.

3. The switching matrix defined in claim 2, wherein said unitary structure is of a comb-like configuration having a common spine from which said drive elements extend in parallel, spaced relation, said spine being affixed to said first means.

4. The switching matrix defined in claim 3, wherein said drive elements extend in opposite directions from opposed sides of said spine.

5. The switching matrix defined in claim 3, which further includes integrated circuitry mounted on said spine for activating said drive element of a selected one of said relays.

6. The switching matrix defined in claim 1, which further includes a housing enclosing said array of relays, said second means being constituted by a wall of said housing.

7. The switching matrix defined in claim 1, wherein each said relay includes first and second fixed contacts mounted by said second means on opposite sides of said movable contact, said drive element of each said relay being selectively activated t engage said movable contact thereof with either one of said first and second fixed contacts.

8. The switching matrix defined in claim 7, which further includes a housing enclosing said array of relays, said second means mounting said first and second fixed contacts of each said relay being constituted by opposed walls of said housing

9. The switching matrix defined in claim 8, wherein said permanent connection of each of said first conductors is to fixed contacts of selected ones of said relays and said permanent connection of each of said second conductors is to said movable contacts of selected ones of said relays.

10. The switching matrix defined in claim g, wherein said first conductors are laid out on surfaces of said opposed housing walls in a manner such as to avoid cross-overs.

11. The switching matrix defined in claim 10, which further includes integrated circuitry mounted within said housing for activating said drive element of a selected one of said piezoelectric relays.

12. A piezoelectric switching matrix comprising, in combination:

a. a planar array of piezoelectric relays, each of said relays including (1) an elongated drive element having opposed fixed and free ends, (2) a first movable contact mounted on said drive element adjacent said free end thereof, and (3) a first pair of first and second fixed contacts;

b. a support member;

c. first means securing said fixed ends of said drive elements in fixed relation to said support member with said drive elements of all of said relays disposed in a common plane;

d. each of said relays having said first pair of first and second fixed contacts thereof disposed on said support member in spaced side-by-side relation and in aligned relation to said first movable contact thereof;

e. four first conductors connected to said first fixed contacts of selected ones of said relays; and f. four second conductors connected to said second fixed contacts of selected ones of said relays, said first and second conductors being disposed on surfaces of said second means as printed circuit runs;

the number of said first conductors, the number of said second conductors, the distribution of their connections to said relay contacts and the number of said relays being related in a manner which enables any one of said first conductors to be connected to any one of said second conductors by activation of said drive element of a corresponding one of said relays to bring said first movable contact thereon into shorting engagement with said first pair of first and second fixed contacts thereof, wherein said corresponding one of said relays is the one of said relays whose closure connects said one of said first conductors to said one of said second conductors.

13. The switching matrix defined in claim 12, wherein said drive elements of said array of relays are formed as a unitary structure of piezoceramic material.

14. The switching matrix defined in claim 13, wherein said unitary structure is of a comb-line configuration having a common spine from which said drive elements extend in parallel spaced relation, said spine being affixed to said first means.

15. The switching matrix defined in claim 14, wherein said drive elements extend in opposite directions from opposed sides of said spine.

16. The switching matrix defined in claim 15, which further includes integrated circuitry mounted on said spine for activating said drive element of a selected one of said piezoelectric relays.

17. The switching matrix defined in claim 12, which further includes a housing enclosing said array of relays, said second means being constituted by a wall of said housing.

18. The switching matrix defined in claim 12, wherein each of said relays further includes:

a second movable contact mounted adjacent said free end of said drive element in electrically isolated relation to said first movable contact thereof; and a second pair of said first and second fixed contacts disposed on said support member for shorting engagement by said second movable contact upon activation of said drive element.

19. The switching matrix defined in claim 18, which further includes a housing enclosing said planar array of relays, said support member constituting at least one wall of said housing.

20. The switching matrix defined in claim 19, wherein said first and second pairs of fixed contacts are respectively mounted on opposed walls of said housing.

21. A piezoelectric switching matrix comprising, in combination:

a. a planar array of piezoelectric relays, each of said relays including (1) an elongated drive element having opposed fixed and free ends, (2) a first set of first and second movable contacts mounted on said drive element adjacent said free end thereof, said first and second movable contacts being disposed in electrically isolated relation to each other on the same side of said drive element and (3) a first set of first and second pairs of first and second fixed contacts;

b. a support member;

c. first means securing said fixed ends of said drive elements in fixed relation to said support member with said drive elements of all of said relays disposed in a common plane;

d. each of said relays having (1) said first pair of first and second fixed contacts thereof disposed on said support member in spaced side-by-side relation in aligned relation to said first movable contact thereof and (2) said second pair of first and second fixed contacts thereof disposed on said support member in spaced side- by-side relation and in aligned relation to said second movable contact thereof;

e. four pairs of first conductors connected to said first fixed contacts of selected ones of said relays, each of said first conductor pairs being connected to selected ones of said relays with the individual conductors of said each pair each connected to a different one of said first fixed contacts of each of said first and second fixed contact pairs of the selected ones of said relays to which each first conductor pair is connected;

f. four pairs of second conductors connected to said second fixed contacts of selected ones of said relays, said first and second conductors being disposed on surfaces of said second means as printed circuits runs and each of said second conductor pairs being connected to selected ones of said relays with the individual conductors of said each pair each connected to a different one of said second fixed contacts of each of said first and second fixed contact pairs of the selected ones of said relays to which said each second conductor pair is connected, the number of said first conductor pairs, the number of said second conductor pairs, the distribution of their connections to said relay contacts and the number of said relays being related in a manner which enables any one of said first conductor pairs to be connected to any one of said second conductor pairs by activation of said drive element of a corresponding one of said relays to bring said first and second movable contacts thereon into shorting engagement with said first and second pairs respectively, of first and second fixed contacts thereof wherein said corresponding one of said relays is the one of said relays whose closure connects said one of said first conductor pairs to said one of said second conductor pairs.

22. The switching matrix defined in claim 21 wherein each of said relays further includes:

a second set of first and second movable contacts mounted on said drive element adjacent said free end thereof; and a second set of first and second pairs of said first and second fixed contacts, said first and second sets of fixed contact pairs being disposed on said support member on opposing sides of said drive element, whereby activation of said drive element in one direction brings said first set of said first and second movable contacts respectively into shorting engagement with said first and second pairs of fixed contacts of said first set of fixed contact pairs, and activation of said drive element in an opposite direction brings said second set of first and second movable contacts respectively into shorting engagement with said first and second pairs of fixed contacts of said second set of fixed contact pairs.

23. The piezoelectric switching matrix recited in claim 1 wherein there are six first conductors and six second conductors.

24. The switching matrix defined in claim 22 which further includes a housing enclosing said planar array of relays, and said support member comprises first and second opposed walls of said housing, said first wall mounting said first set of fixed contacts and said second wall mounting said second set of fixed contacts.

25. The switching matrix defined in claim 24, wherein said first and second conductor pairs are laid out as printed circuit runs on opposed surfaces of said first and second housing walls in a non-crossing manner with at least some of said runs including conductive transitions between opposed surfaces of a given wall.

26. The switching matrix defined in claim 25, wherein said drive elements of said planar array of relays are formed as a unitary structure of piezoceramic material.

27. The switching matrix defined in claim 26, wherein said unitary structure is of a comb-like configuration having a common spine from which said drive elements extend in parallel, spaced relation, said spine being affixed to said first means.

28. The switching matrix defined in claim 27, wherein said drive elements extend in opposite directions from opposed sides of said spine.

29. The switching matrix defined in claim 28, which further includes integrated circuitry mounted on said spine for activating said drive element of a selected one of said piezoelectric relays.

30. A piezoelectric switching matrix comprising, in combination:

a. an insulative substrate having a pedestal;

b. a planar array of piezoelectric relays, each of said relays including (1) an elongated drive element having opposed fixed and free ends, said drive element fixedly cantilever mounted adjacent its fixed end on said pedestal, (2) a movable contact mounted on said drive element adjacent said free end thereof, and (3) a pair of first and second fixed contacts mounted on a surface of said substrate in aligned relation to said movable contact;

c. first and second pluralities of four terminals each;

d. a plurality of first conductors individually connected from terminals of said first plurality to said first fixed contacts of selected ones of said relays; and e. a plurality of second conductors individually connected from terminals of said second plurality to said second fixed contacts of selected ones of said relays, said first and second conductors being disposed on at,, least one surface of said substrate as printed circuit runs;

said drive elements of all of said relays being disposed in a common plane;

the number of said first conductors, the number of said second conductors, the distribution of their connections to said relay contacts and the number of relays being related in a manner which enables any one terminal of said first plurality to be connected to any one terminal of said second plurality by activation of said drive element of a corresponding one of said relays to bring said movable contact thereof into shorting engagement with said first and second fixed contacts thereof, wherein said corresponding one of said relays is the one of said relays whose closure connects said one terminal of said first plurality to said one terminal of said second plurality.

31. The switching matrix defined in claim 30, wherein said drive elements of said array of relays are formed as a unitary structure of piezoceramic material.

32. The switching matrix defined in claim 31, wherein said unitary structure is of a comb-like configuration having a common spine from which said drive elements extend in parallel spaced relation, said spine being affixed to said pedestal.

33. The switching matrix defined in claim 32, wherein said drive elements extend in opposite directions from opposed sides of said spine.

34. The switching matrix defined in claim 31, wherein said first and second terminal pluralities are mounted on said substrate.

35. The switching matrix defined in claim 34, which further includes integrated circuitry for activating said drive element of a selected relay, and a third plurality of said terminals connected with said integrated circuitry by printed circuit runs laid out on at least one of said first and second substrate surfaces.

36. The switching matrix defined in claim 30 wherein at least one of said first conductors is disposed on said substrate in a serpentine pattern to interconnect said ones of said first fixed contacts to which it is connected without need for others of said first conductors disposed on the same surface of said substrate to cross over said at least one first conductor to reach fixed contacts to which they are connected.

37. The switching matrix defined in claim 1 wherein said support member comprises a printed circuit substrate.

38. The switching matrix defined in claim 37 wherein at least one of said first conductors is disposed on said substrate in a serpentine pattern to interconnect the ones of said fixed contacts to which it is connected without need for others of said first conductors disposed on the same surface of said substrate to cross over said at least one first conductor to reach the ones of said fixed contacts to which they are connected.

39. The switching matrix defined in claim 12 wherein said support member comprises a printed circuit substrate and at least said first conductors are disposed thereon as printed conductors.

40. The switching matrix defined in claim 39 wherein at least one of said first conductors is disposed on said substrate in a serpentine pattern to interconnect the ones of said first fixed contacts to which it is connected without need for others of said first conductors disposed on the same surface of said substrate to cross over said at least one first conductor to reach the ones of said first fixed contacts to which they are connected.

41. The switching matrix defined in claim 25 wherein said housing walls comprise printed circuit substrates.

42. The switching matrix defined in claim 18 wherein said drive element of said relay includes a bifurcation extending a first distance from the free end thereof along the length of said drive element between said first and second movable contacts to allow them to deflect to different degrees upon activation of said drive element; and each of said first and second movable contacts includes first and second contact portions which are spaced apart by second bifurcations extending a second distance said drive element whereby the separate portions of a given movable contact can deflect to different degrees upon activation of said drive element.

43. The switching matrix defined in claim 42 wherein said second distance is less than said first distance.

44. In a piezoelectric switch of the type comprising an array of piezoelectric bimorph drive elements, each of said drive elements having a drive metallization extending along the length thereof and each carrying a movable contact which is aligned with a pair of fixed contacts which said movable contact bridges upon appropriate activation of that drive element, the improvement comprising:

each of said drive elements having first and second movable contacts disposed thereon on the same side thereof;

said drive element including first, second and third bifurcations extending into said drive element from the free end thereof for first, second and third distances, respectively, along the length of said drive element, each of said first, second and third distances being less than the length of said drive element, said third bifurcation being disposed between said first and second bifurcations, said first movable contact disposed on a first side of said third bifurcation and having first and second portions disposed on opposed sides of said first bifurcation, and said second movable contact disposed on a second side of said third bifurcation and having first and second portions disposed on opposed sides of said second bifurcation whereby said first and second portions of each of said movable contacts can deflect to different degrees upon activation of said drive element;

the drive metallization of said drive element extending along the non-bifurcated portion of said element and along at least part of the bifurcated portion of said element.

45. In a piezoelectric switch of the type comprising an array of piezoelectric bimorph drive elements, each of said drive element having drive metallization extending along the length thereof and each carrying a movable contact which is aligned with a pair of fixed contacts which said movable contact bridges upon appropriate activation of that drive element, the improvement comprising:

each of said drive elements having first and second movable contacts disposed thereon on the same side thereof;

said drive element including first, second and third bifurcations extending into said drive element from the free end thereof for first, second and third distances, respectively, along the length of said drive element, each of said first, second and third distances being less than the length of said drive element, and said third distance being greater than said first and second distances, said third bifurcation being disposed between said first and second bifurcations, said first movable contact disposed on a first side of said third bifurcation and having first and second portions disposed on opposed sides of said first bifurcation and said second movable contact disposed on a second side of said third bifurcation and having first and second portions disposed on opposed sides of said second bifurcation whereby said first and second portions of each of said movable contacts can deflect to different degrees upon activation of said drive element;

the drive metallization of said drive element extending along the non-bifurcated portion of said element and along at least part of the bifurcated portion of said element.

46. The switch defined in claim 45 wherein said first and second distances are equal.

47. The piezoelectric switching matrix recited in claim 12 wherein there are six first conductors and six second conductors.

48. The piezoelectric switching matrix recited in claim 30 wherein said first and second pluralities of terminals each comprise six terminals.

49. A piezoelectric switching matrix comprising, in combination:

a. a planar array of at least 16 piezoelectric relays, each of said relays including (1) an elongated drive element having opposed fixed and free ends, (2) a movable contact mounted on said drive element adjacent said free end thereof, and (3) a fixed contact, b. a support member;

c. first means securing said fixed ends of said elements in fixed relation to said support member with said drive elements of all of said relays disposed in a common plane;
d. each of said relays having said fixed contact thereof disposed on said support member in aligned relation to said movable contact thereof;
e. at least four first conductors disposed on said support member as printed circuit conductors; and
f. at least four second conductors;

each of said relays having either said fixed or movable contact thereof permanently connected to one of said first conductors and the other of said fixed and movable contacts thereof permanently connected to one of said second conductors, each of said first and second conductors being permanently connected to at least one of said contacts of at least two different ones of said relays and the number of said first conductors, the number of said second conductors, the distribution of their connections to said relay contacts and the number of relays being related in a manner which enables each of said first conductors to be connected to any one of a selected set of said second conductors by activation of said drive element of a corresponding one of said relays to engage said fixed and movable contacts thereof wherein said corresponding one of said relays is the one of said relays whose closure connects said first conductor to the selected one of said second conductors.

50. The switching matrix defined in claim 49 wherein: there are at least six first conductors and at least six second conductors.

51. The switching matrix defined in claim 50 wherein: there are at least twelve second conductors.

52. The switching matrix defined in claim 49, wherein said drive elements of said planar array of relays are formed as a unitary structure of piezoceramic material.

53. The switching matrix defined in claim 52, wherein said unitary structure is of a comb-like configuration having a common spine from which said drive elements extend in parallel, spaced relation, said spine being affixed to said first means.

54. The switching matrix defined in claim 53, wherein said drive elements extend in opposite directions from opposed sides of said spine.

55. The switching matrix defined in claim 53, which further includes integrated circuitry mounted on said spine for activating said drive element of a selected one of said relays.

56. The switching matrix defined in claim 49, which further includes a housing enclosing said array of relays, said second means being constituted by a wall of said housing.

57. The switching matrix defined in claim 49, wherein each said relay includes first and second fixed contacts mounted by said second means on opposite sides of said movable contact, said drive element of each said relay being selectively activated to engage said movable contact thereof with either one of said first and second fixed contacts.

58. The switching matrix defined in claim 57, which further includes a housing enclosing said array of relays, said second means mounting said first and second fixed contacts of each said relay being constituted by opposed walls of said housing.

59. The switching matrix defined in claim 58, wherein said permanent connection of each of said first conductors is to fixed contacts of selected ones of said relays and said permanent connection of each of said second conductors is to said movable contacts of selected ones of said relays.

60. The switching matrix defined in claim 59, wherein said first conductors are laid out on surfaces of said opposed housing walls in a manner such as to avoid cross-overs.

61. The switching matrix defined in claim 60, which further includes integrated circuitry mounted within said housing for activating said drive element of a selected one of said piezoelectric relays.

62. The switching matrix defined in claim 49 wherein said support member comprises a printed circuit substrate.

63. The switching matrix defined in claim 62 wherein at least one of said first conductors is disposed on said substrate in a serpentine pattern to interconnect the ones of said fixed contacts to which it is connected without need for others of said first conductors disposed on the same surface of said substrate to cross over said at least one of first conductor to reach the ones of said fixed contacts to which they are connected.

64. A piezoelectric switching matrix comprising, in combination:

a. a planar array of at least 16 piezoelectric relays, each of said relays including
(1) an elongated drive element having opposed fixed and free ends,
(2) a first movable contact mounted on said drive
(3) a first pair of first and second fixed contacts;
b. a support member;
c. first means securing said fixed ends of said drive elements in fixed relation to said support member with said drive elements of all of said relays disposed in a common plane;
d. each of said relays having said first pair of first and second fixed contacts thereof disposed on said support member in spaced side-by-side relation and in aligned relation to said first movable contact thereof;
e. at least four first conductors connected to said first fixed contacts of selected ones of said relays; and
f. at least four second conductors connected to said second fixed contacts of selected ones of said relays, said first and second conductors being disposed on surfaces of said second means as printed circuit runs;

each of said relays having either said first or second fixed contact thereof permanently connected to one of said first conductors and the other of said first and second fixed contacts thereof permanently connected to one of said second conductors, the number of said first conductors, the number of said second conductors, the distribution of their connections to said relay contacts and the number of said relays being related in a manner which enables each of said first conductors to be connected to any one of a selected set of said second conductors by activation of said drive element of a corresponding one of said relays to bring said first movable contact thereon into shorting engagement with said first pair of first and second fixed contacts thereof, wherein said corresponding one of said relays is the one of said relays whose closure connects said first conductor to the selected one of said second conductors.

65. The switching matrix defined in claim 64 wherein:

there are at least six first conductors and at least six second conductors.

66. The switching matrix defined in claim 65 wherein: there are at least twelve second conductors.

67. The switching matrix defined in claim 64, wherein said drive elements of said array of relays are formed as a unitary structure of piezoceramic material.

68. The switching matrix defined in claim 67, wherein said unitary structure is of a comb-line configuration having a common spine from which said drive elements extend in parallel spaced relation, said spine being affixed to said first means.

69. The switching matrix defined in claim 68, wherein said drive elements extend in opposite directions from opposed sides of said spine.

70. The switching matrix defined in claim 69, which further includes integrated circuitry mounted on said spine for activating said drive element of a selected one of said piezoelectric relays.

71. The switching matrix defined in claim 64, which further includes a housing enclosing said array of relays, said second means being constituted by a wall of said housing.

72. The switching matrix defined in claim 64, wherein each of said relays further includes:

a second movable contact mounted adjacent said free end of said drive element in electrically isolated relation to said first movable contact thereof; and a second pair of said first and second fixed contacts disposed on said support member for shorting engagement by said second movable contact upon activation of said drive element.

73. The switching matrix defined in claim 72, which further includes a housing enclosing said planar array of relays, said support member constituting at least one wall of said housing.

74. The switching matrix defined in claim 73, wherein said first and second pairs of fixed contacts are respectively mounted on opposed walls of said housing.

75. The switching matrix defined in claim 64 wherein said support member comprises a printed circuit substrate and at least said first conductors are disposed thereon as printed conductors.

76. The switching matrix defined in claim 75 wherein at least one of said first conductors is disposed on said substrate in a serpentine pattern to interconnect the ones of said first fixed contacts to which it is connected without need for others of said first conductors disposed on the same surface of said substrate to cross over said at least one first conductor to reach the ones of said first fixed contact to which they are connected.

77. A piezoelectric switching matrix comprising, in combination:

a. a planar array of at least 16 piezoelectric relays, each of said relays including (1) an elongated drive element having opposed fixed and free ends, (2) a first set of first and second movable contacts mounted on said drive element adjacent said free end thereof, said first and second movable contacts being disposed in electrically isolated relation to each other on the same side of said drive element and (3) a first set of first and second pairs of first and second fixed contacts;

b. a support member;

c. first means securing said fixed ends of said drive elements in fixed relation to said support member with said drive elements of all of said relays disposed in a common plane;

d. each of said relays having (1) said first pair of first and second fixed contacts thereof disposed on said support member in spaced side-by-side relation in aligned relation to said first movable contact thereof and (2) said second pair of first and second fixed contacts thereof disposed on said support member in spaced side- by-side relation and in aligned relation to said second movable contact thereof;

e. at least four pairs of first conductors connected to said first fixed contacts of selected ones of said relays, each of said first conductor pairs being connected to selected ones of said relays with the individual conductors of said each pair each connected to a different one of said first fixed contacts of each of said first and second fixed contact pairs of the selected ones of said relays to which each first conductor pair is connected;

f. at least four pairs of second conductors connected to said second fixed contacts of selected ones of said relays, said first and second conductors being disposed on surfaces of said second means as printed circuits runs and each of said second conductor pairs being connected to selected ones of said relays with the individual conductors of said each pair each connected to a different one of said second fixed contacts of each of said first and second fixed contact pairs of the selected ones of said relays to which said each second conductor pair is connected, each of said relays having either said first fixed contacts or said second fixed contacts thereof permanently connected to one of said pairs of first conductors and the other of said first fixed contacts and said second fixed contacts thereof permanently connected to one of said pairs of second conductors, the number of said first conductor pairs, the number of said second conductor pairs, the distribution of their connections to said relay contacts and the number of said relays being related in a manner which enables each of said first conductor pairs to be connected to any one of a selected set of said second conductor pairs by activation of said drive element of a corresponding one of said relayed to bring said first and second movable contacts thereon into shorting engagement with said first and second pairs respectively, of first and second fixed contacts thereof wherein said corresponding one of said relays is the one of said relays whose closure connects said first conductor pair to the selected one of said second conductor pairs.

78. The switching matrix defined in claim 77 wherein each of said relays further includes:

a second set of first and second movable contacts mounted on said drive element adjacent said free end thereof; and a second set of first and second pairs of said first and second fixed contacts, said first and second sets of fixed contact pairs being disposed on said support member on opposing sides of said drive element, whereby activation of said drive element in one direction brings said first set of said first and second movable contact respectively into shorting engagement with said first and second pairs of fixed contacts of said first set of fixed contact pairs, and activation of said drive element in an opposite direction brings said second set of first and second movable contacts respectively into shorting engagement with said first and second pairs of fixed contacts of said second set of fixed contact pairs.

79. The switching matrix defined in claim 78 which further includes a housing enclosing said planar array of relays, and said support member comprises first and second opposed walls of said housing, said first wall mounting said first set of fixed contacts and said second wall mounting said second set of fixed contacts.

80. The switching matrix defined in claim 79, wherein said first and second conductor pairs are laid out as printed circuit runs on opposed surfaces of said first and second housing walls in a non-crossing manner with at least some of said runs including conductive transitions between opposed surfaces of a given wall.

81. The switching matrix defined in claim 80, wherein said drive elements of said planar array of relays are formed as a unitary structure of piezoceramic material.

82. The switching matrix defined in claim 81, wherein said unitary structure is of a comb-like configuration having a common spine from which said drive elements extend in parallel, spaced relation, said spine being affixed to said first means.

83. The switching matrix defined in claim 82, wherein said drive elements extend in opposite directions from opposed sides of said spine.

84. The switching matrix defined in claim 83 which further includes integrated circuitry mounted on said spine for activating said drive element of a selected one of said piezoelectric relays.

85. The switching matrix defined in claim 80 wherein said housing walls comprise printed circuit substrates.

86. A piezoelectric switching matrix comprising, in combination:

a. an insulative substrate having a pedestal;

b. a planar array of at least 16 piezoelectric relays, each of said relays including (I) an elongated drive element having opposed fixed and free ends, said drive element fixedly cantilever mounted adjacent its fixed end on said pedestal, (2) a movable contact mounted on said drive element adjacent said free end thereof, and (3) a pair of first and second fixed contacts mounted on a surface of said substrate in aligned relation to said movable contact;

c. first and second pluralities of terminals, each including at least four terminals;

d. a plurality of first conductors individually connected from terminals of said first plurality to said first fixed contacts of selected ones of said relays; and e. a plurality of second conductors individually connected from terminals of said second plurality to said second fixed contacts of selected ones of said relays, said first and second conductors being disposed on at least one surface of said substrate as printed circuit runs;

said drive elements of all of said relays being disposed in a common plane;

each of said relays having either said first or second fixed contact thereof permanently connected to one of said first terminals and the other of said first and second fixed contacts thereof permanently connected to one of said second terminals, the number of said first conductors, the number of said second conductors, the distribution of their connections to said relay contacts and the number of relays being related in a manner which enables each terminal of said first plurality to be connected to any one of a selected set of said second plurality of terminals by activation of said drive element of a corresponding one of said relays to bring said movable contact thereof into shorting engagement with said first and second fixed contacts thereof, wherein said corresponding one of said relays is the one of said relays whose closure connects said terminal of said first plurality to the selected terminal of said second plurality.

87. The switching matrix defined in claim 86 wherein:

there are at least six terminals in said first plurality of terminals and at least six terminals in said second plurality of terminals.

88. The switching matrix defined in claim 87 wherein:

there are at least twelve terminals in said second plurality of terminals.

89. The switching matrix defined in claim 86, wherein said drive elements of said array of relays are formed as a unitary structure of piezoceramic material.

90. The switching matrix defined in claim 89, wherein said unitary structure is of a comb-like configuration having a common spine from which said drive elements extend in parallel spaced relation, said spine being affixed to said pedestal.

91. The switching matrix defined in claim 90, wherein said drive elements extend in opposite directions from opposed sides of said spine.

92. The switching matrix defined in claim 89, wherein said first and second terminal pluralities are mounted on said substrate.

93. The switching matrix defined in claim 92, which further includes integrated circuitry for activating said drive element of a selected relay, and a third plurality of said terminals connected with said integrated circuitry by printed circuit runs laid out on at least one of said first and second substrate surfaces.

94. The switching matrix defined in claim 86 wherein at least one of said first conductors is disposed on said substrate in a serpentine pattern to interconnect said ones of said first fixed contacts to which it is connected without need for others of said first conductors disposed on the same surface of said substrate to cross over said at least one first conductor to reach fixed contacts to which they are connected.

* * * * *